(12) United States Patent
Wang et al.

(45) Date of Patent: Aug. 16, 2005
(10) Patent No.: US 6,930,029 B2

(54) METHOD OF PASSIVATING AN OXIDE SURFACE SUBJECTED TO A CONDUCTIVE MATERIAL ANNEAL

(75) Inventors: Zhongze Wang, Boise, ID (US); Li Li, Meridian, ID (US); Yongjun Jeff Hu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 159 days.

(21) Appl. No.: 10/263,921

(22) Filed: Oct. 3, 2002

(65) Prior Publication Data

US 2003/0060039 A1 Mar. 27, 2003

Related U.S. Application Data

(62) Division of application No. 09/631,329, filed on Aug. 3, 2000, now Pat. No. 6,559,053, which is a division of application No. 09/146,296, filed on Sep. 3, 1998, now Pat. No. 6,555,455.

(51) Int. Cl.[7] ............................................. H01L 21/44
(52) U.S. Cl. .................... 438/586; 438/683; 438/592
(58) Field of Search ................................ 438/585, 660, 438/663, 751, 30, 774, 744, 743, 713, 736, 592, 653, 655, 656, 657, 664, 775, 776, 618, 682, 249, 586, 583, 584, 149, 150, 151, 909, 233, 558, 542, 630

(56) References Cited

U.S. PATENT DOCUMENTS

| | | | | |
|---|---|---|---|---|
| 4,690,730 A | * | 9/1987 | Tang et al. ................. | 438/649 |
| 5,093,710 A | * | 3/1992 | Higuchi ..................... | 257/764 |
| 5,288,666 A | | 2/1994 | Lee | |
| 5,326,724 A | * | 7/1994 | Wei ............................ | 438/655 |
| 5,352,623 A | | 10/1994 | Kamiyama | |
| 5,416,045 A | | 5/1995 | Kauffman et al. | |
| 5,423,923 A | | 6/1995 | Yamagata et al. | |
| 5,451,545 A | | 9/1995 | Ramaswami et al. | |
| 5,508,221 A | | 4/1996 | Kamiyama | |
| 5,514,257 A | | 5/1996 | Kobayashi et al. | |
| 5,545,592 A | * | 8/1996 | Iacoponi ..................... | 438/655 |
| 5,624,868 A | | 4/1997 | Iyer | |
| 5,652,180 A | | 7/1997 | Shinriki et al. | |
| 5,656,546 A | * | 8/1997 | Chen et al. ................ | 438/586 |
| 5,688,718 A | * | 11/1997 | Shue ........................... | 438/627 |
| 5,691,212 A | | 11/1997 | Tsai et al. | |
| 5,693,541 A | | 12/1997 | Yamazaki et al. | |
| 5,700,718 A | | 12/1997 | McTeer | |
| 5,733,816 A | * | 3/1998 | Iyer et al. ................... | 438/592 |
| 5,736,421 A | | 4/1998 | Shimomura et al. | |
| 5,741,734 A | | 4/1998 | Lee | |
| 5,750,441 A | | 5/1998 | Figura et al. | |
| 5,843,225 A | | 12/1998 | Takayama et al. | |

(Continued)

FOREIGN PATENT DOCUMENTS

JP              405070927           3/1993

*Primary Examiner*—Laura Schillinger
(74) *Attorney, Agent, or Firm*—Mueting, Raasch & Gebhardt, P.A.

(57) ABSTRACT

A method of preventing formation of titanium oxide within a semiconductor device structure during a high temperature treatment of the device structure includes forming a passivation layer to preclude formation of titanium oxide at a titanium/oxide interface of a semiconductor device structure. The method includes providing a substrate assembly including at least an oxide region and forming a layer of titanium over a surface of the oxide region. The oxide region surface is treated with a plasma comprising nitrogen prior to forming the titanium layer so as to form a passivation layer upon which the titanium layer is formed. A thermal treatment is performed on the substrate assembly with the passivation layer substantially inhibiting diffusion of oxygen from the oxide layer during the thermal treatment of the substrate assembly. Generally, the passivation layer comprises $Si_xO_yN_z$.

9 Claims, 9 Drawing Sheets

U.S. PATENT DOCUMENTS

| | | | |
|---|---|---|---|
| 5,856,237 A | | 1/1999 | Ku |
| 5,858,183 A | | 1/1999 | Wolters et al. |
| 5,880,777 A | | 3/1999 | Savoye et al. |
| 5,897,365 A | | 4/1999 | Matsubara |
| 5,909,244 A | | 6/1999 | Waxman et al. |
| 5,912,508 A | * | 6/1999 | Iacoponi ............... 257/770 |
| 5,926,730 A | * | 7/1999 | Hu et al. ............... 438/592 |
| 5,983,906 A | | 11/1999 | Zhao et al. |
| 6,001,420 A | * | 12/1999 | Mosely et al. ............ 427/258 |
| 6,002,150 A | * | 12/1999 | Gardner et al. ............ 257/310 |
| 6,008,077 A | | 12/1999 | Maeda |
| 6,008,124 A | * | 12/1999 | Sekiguchi et al. .......... 438/653 |
| 6,015,997 A | * | 1/2000 | Hu et al. ............... 257/412 |
| 6,048,764 A | | 4/2000 | Suzuki et al. |
| 6,051,462 A | * | 4/2000 | Ohno ............... 438/241 |
| 6,063,700 A | * | 5/2000 | Sandhu et al. ............ 438/597 |
| 6,071,552 A | * | 6/2000 | Ku ............... 427/99 |
| 6,077,737 A | | 6/2000 | Yang et al. |
| 6,080,444 A | | 6/2000 | Shimuzu et al. |
| 6,087,225 A | | 7/2000 | Bronner et al. |
| 6,096,599 A | * | 8/2000 | Kepler et al. ............ 438/249 |
| 6,121,139 A | | 9/2000 | Chang et al. |
| 6,136,641 A | * | 10/2000 | Won et al. ............ 438/240 |
| 6,162,713 A | * | 12/2000 | Chen et al. ............ 438/585 |
| 6,184,135 B1 | * | 2/2001 | Ku ............... 438/683 |
| 6,210,999 B1 | * | 4/2001 | Gardner et al. ............ 438/183 |
| 6,214,714 B1 | * | 4/2001 | Wang et al. ............ 438/592 |
| 6,242,776 B1 | * | 6/2001 | Hause et al. ............ 257/344 |
| 6,251,720 B1 | * | 6/2001 | Thakur et al. ............ 438/240 |
| 6,255,703 B1 | * | 7/2001 | Hause et al. ............ 257/384 |
| 6,274,487 B1 | | 8/2001 | Suzuki |
| 6,277,736 B1 | | 8/2001 | Chen et al. |
| 6,326,690 B2 | * | 12/2001 | Wang et al. ............ 257/751 |
| 6,358,766 B1 | | 3/2002 | Kasahara |
| 6,376,355 B1 | * | 4/2002 | Yoon et al. ............ 438/618 |
| 6,423,628 B1 | * | 7/2002 | Li et al. ............ 438/622 |
| 6,432,801 B1 | * | 8/2002 | Lee ............... 438/585 |
| 6,436,805 B1 | | 8/2002 | Trivedi |
| 6,436,818 B1 | * | 8/2002 | Hu et al. ............ 438/656 |
| 6,461,899 B1 | | 10/2002 | Kitakado et al. |
| 6,486,020 B1 | * | 11/2002 | Thakur et al. ............ 438/240 |
| 6,525,384 B2 | * | 2/2003 | Hu et al. ............ 257/411 |
| 6,555,455 B1 | * | 4/2003 | Wang et al. ............ 438/585 |
| 6,559,053 B1 | * | 5/2003 | Wang et al. ............ 438/683 |
| 6,579,789 B2 | * | 6/2003 | Jeong ............... 438/627 |
| 6,774,022 B2 | * | 8/2004 | Wang et al. ............ 438/585 |
| 6,794,756 B2 | * | 9/2004 | Li et al. ............ 257/760 |

* cited by examiner

Overlays of the Oxygen Concentrations from 300 Titanium with Different Plasma Treatments

METHOD OF PASSIVATING AN OXIDE SURFACE SUBJECTED TO A CONDUCTIVE MATERIAL ANNEAL

This is a division of application Ser. No. 09/631,329, filed Aug. 3, 2000, now U.S. Pat. No. 6,559,053, which is a division of application Ser. No. 09/146,296, filed Sep. 3, 1998, now U.S. Pat. No. 6,555,455 which are all incorporated herein by reference.

FIELD OF THE INVENTION

The present invention is related to the fabrication of semiconductor devices and, more particularly, to a method of passivating an oxide surface subjected to a conductive material anneal, e.g., a titanium anneal.

BACKGROUND OF THE INVENTION

Various metalization, interconnect, and polycide formation processes are known and used in the fabrication of semiconductor devices. In the fabrication of many of such semiconductor devices, a conductive material such as titanium is used, for example, to form an ohmic contact to a silicon substrate. For example, in accordance with a conventional salicide or silicide fabrication process, titanium is often deposited on a semiconductor device structure which includes a silicon surface, e.g., contact area, and a silicon dioxide surface, e.g., field oxide surface. After forming a titanium layer on the silicon surface and silicon dioxide surface, the device structure may be subjected to a high temperature anneal, so as to form titanium suicide in the region where the titanium contacts the silicon surface and/or titanium nitride over portions of the structure.

In accordance with such a conventional fabrication approach, titanium oxide is likely to form at an interface between the titanium and silicon dioxide regions. During silicidation and/or salicidation processes, this interfacial titanium oxide formation can adversely affect the operational and reliability characteristics of the subject semiconductor device, such as by increasing contact resistance within the device and/or by encroaching into the active area of a circuit structure being formed. Undesirable titanium oxide formation may also adversely affect the thermal stability of the subject semiconductor device. The formation of interfacial titanium oxide during the fabrication of a titanium nitride local interconnect results in similar reliability and operational anomalies in the subject semiconductor device.

Further complicating known processes that utilize titanium in the fabrication of semiconductor device structures is the difficulty of removing titanium oxide within the device structure during conventional processing. By way of example, and in accordance with a conventional salicidation process, titanium oxide is generally not removed with use of traditional etching or cleaning techniques, during which undesired material such as titanium nitride or unreacted titanium is removed leaving titanium silicide as an ohmic contact to the silicon substrate.

SUMMARY OF THE INVENTION

There exists a keenly felt need in the semiconductor manufacturing industry for a method of reducing or substantially eliminating the likelihood of interfacial metal oxide formation, such as titanium oxide formation, at a titanium/silicon dioxide interface of a semiconductor device structure. There exists a further need for such a method that may be employed in silicidation, salicidation, and other fabrication processes, such as in the formation of interconnects. There exists yet a further need for such a method which may be easily integrated into existing fabrication processes without resort to additional processing components and without requiring significant modification to existing processing methods. The present invention fulfills these and other needs.

The present invention is directed to a method of preventing formation of titanium oxide within a semiconductor device structure during a high temperature treatment of the device structure. In particular, a method of forming a passivation layer in accordance with the present invention precludes formation of a metal oxide such as titanium oxide at a titanium/silicon dioxide interface of a semiconductor device structure.

A method according to the present invention for use in the fabrication of semiconductor devices includes forming an oxide region on a surface of a substrate. A layer of titanium is subsequently formed over a surface of at least the oxide region. Prior to forming the titanium layer, the substrate, including an oxide region, is exposed to a nitrogen containing atmosphere so as to inhibit formation of a titanium oxide layer on the oxide region surface during a subsequent thermal treatment.

In accordance with an embodiment of the present invention, a surface of the oxide region is exposed to a plasma containing nitrogen, such as a plasma comprising $N_2$ or $NH_3$. A passivation layer, typically including $Si_xO_yN_z$, is formed over the oxide surface, and titanium is subsequently deposited over the device structure. The device structure is subjected to a high temperature anneal or a rapid thermal process in a nitrogen containing atmosphere or, alternatively, an atmosphere devoid of nitrogen.

In accordance with another embodiment, a method for use in the fabrication of a semiconductor device includes forming a layer of titanium on a surface including at least an oxide region. Prior to forming the titanium layer, the surface of the oxide region is treated so as to reduce diffusion of oxygen from the oxide region. The oxide region is treated by exposing the surface of the oxide region to a nitrogen containing plasma, such as a plasma comprising $N_2$ or $NH_3$.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

Figure 1:
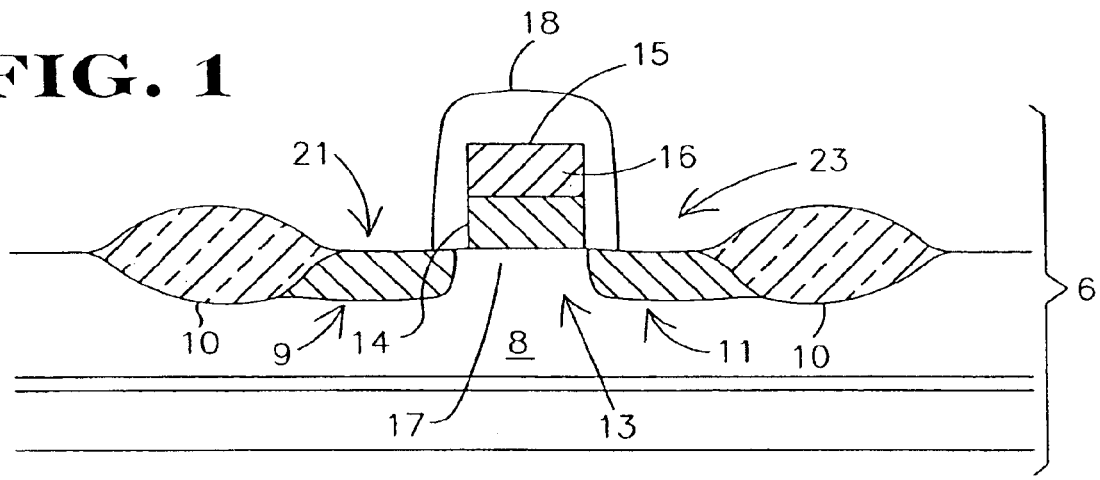
FIGS. 1–5 are illustrative diagrams showing various steps associated with the formation of an ohmic contact on a silicon substrate.

While the invention is amenable to various modifications and alternative forms, specifics thereof have been shown by way of example in the drawings and will be described in detail hereinbelow. It is to be understood, however, that the intention is not to limit the invention to the particular embodiments described. On the contrary, the invention is intended to cover all modifications, equivalents, and alternatives falling within the scope of the invention as defined by the appended claims.

DETAILED DESCRIPTION OF VARIOUS EMBODIMENTS

In the following description of the illustrated embodiments, references are made to the accompanying drawings which form a part hereof, and in which is shown by way of illustration, various embodiments in which the invention may be practiced. It is to be understood that other embodiments may be utilized, and structural and functional changes may be made without departing from the scope of the present invention.

The present invention shall be generally described with reference to the Figures. With the description as provided below, it is readily apparent to one skilled in the art that the various processes described with respect to the Figures may be utilized alone as separate processes, with process steps from one substituted for process steps of the other, or in various configurations, with process steps of one used as additional process steps or in combination with the process steps of the other. As such, the present invention is not limited to the particular process steps implicated in the Figures.

Generally, FIGS. 1–5 depict various steps associated with a salicidation process for formation of ohmic contacts which may be advantageously modified to include a passivation process according to the present invention to inhibit formation of titanium oxide at an interface between a layer of titanium and a surface of silicon dioxide. Increased device reliability, thermal stability, and a reduction in contact resistance, among other benefits, are realized by exposing the silicon dioxide surface to an atmosphere containing nitrogen during the passivation process. In particular, exposing a silicon dioxide surface to a plasma containing $N_2$ or $NH_3$, for example, prior to depositing a layer of conductive material, such as titanium on the silicon dioxide surface, has been found to significantly reduce, or altogether prevent, diffusion of oxygen out of the silicon dioxide layer and preclude undesirable formation of titanium oxide at a titanium/silicon dioxide interface.

FIGS. 1–5 depict various steps associated with the formation of ohmic contacts on a silicon substrate for a transistor structure. Device structure 6, as is shown in FIG. 1, includes a semiconductor substrate 8 which may include a base layer of silicon material for the device being fabricated or a silicon layer formed on another material, such as, for example, silicon on sapphire. The various steps associated with a salicidation process which may advantageously employ the passivation process of the present invention will now be described with reference to FIGS. 1–5.

FIGS. 1–5 are illustrative of process steps associated with the fabrication of a semiconductor device which includes field oxide regions 10 formed on a substrate 8 defining active area 13 therebetween. The device structure 6 further includes a gate structure 15 which may include, for example, polysilicon region 14 and metal silicide region 16 formed over a gate insulating film 17. Oxide material 18, such as TEOS from which spacers may be formed, is provided above gate structure 15. Still further, the device structure 6 includes source and drain regions 9, 11.

Figure 2:
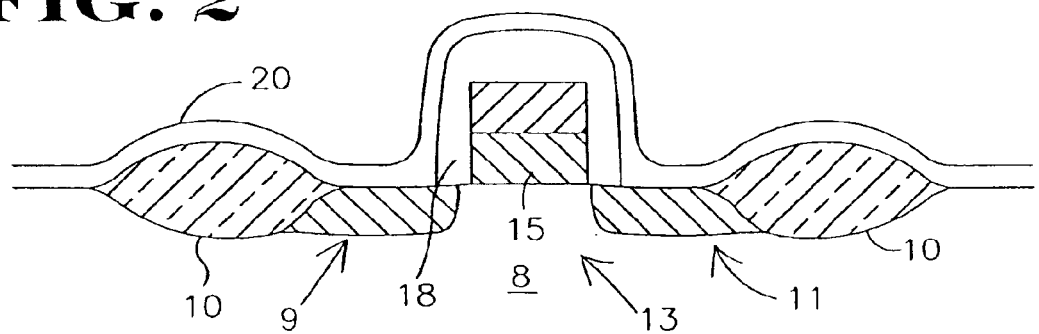

In accordance with a salicidation process which utilizes titanium to form titanium silicide in the contact areas 21, 23, and as is further shown in FIG. 2, a layer of titanium 20 is deposited over the device structure, such as by sputtering or other known deposition processes. The structure shown in FIG. 2 is then annealed to silicide the contact regions 21, 23, such as in an atmosphere containing nitrogen.

Figure 3:
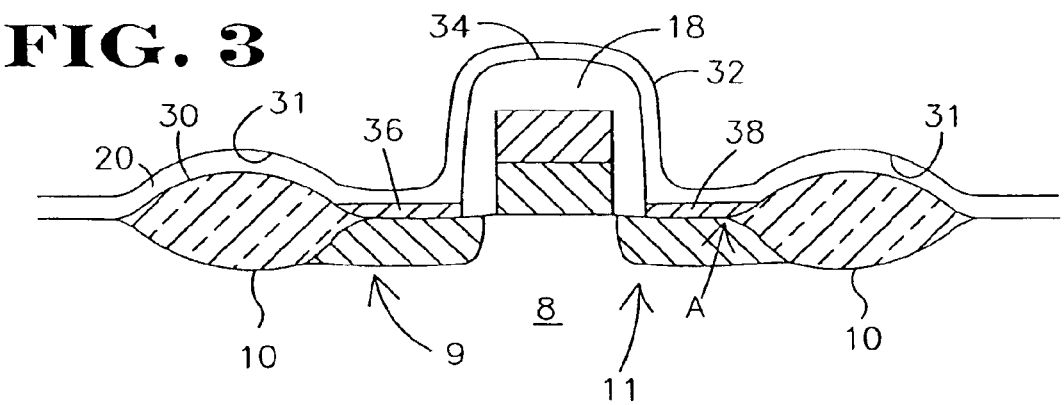

As is further depicted in FIG. 3, at least a lower portion 30 of titanium layer 20 reacts therewith in contact with the silicon substrate 8 in the source drain regions 9, 11 to form titanium silicide ($TiSi_x$) regions 36, 38 in contact areas 21, 23 for establishing electrical connection to source drain regions 9 and 11, respectively. The upper portion 31 of titanium layer 20 in the contact regions 21, 23 reacts with the nitrogen atmosphere to form a titanium nitride ($TiN_x$) layer 32 if a nitrogen containing atmosphere is used for the anneal. With respect to the field oxide regions 10 and other oxide regions, such as oxide material 18, including oxide spacers, at least the upper portion 31 of titanium layer 20 reacts with the nitrogen atmosphere to form titanium nitride ($TiN_x$), while the bottom portion 30 of titanium layer 20 reacts with the oxide to form an interfacial layer of titanium oxide ($TiO_2$) and possibly titanium silicide ($TiSi_x$). This undesirable interfacial titanium oxide is not etched away during subsequent cleaning procedures, such as an APM cleaning procedure, which is typically used to etch away the titanium nitride layer so as to leave only titanium silicide as an ohmic contact to the silicon substrate 8 in the contact areas 21, 23.

Figure 4:
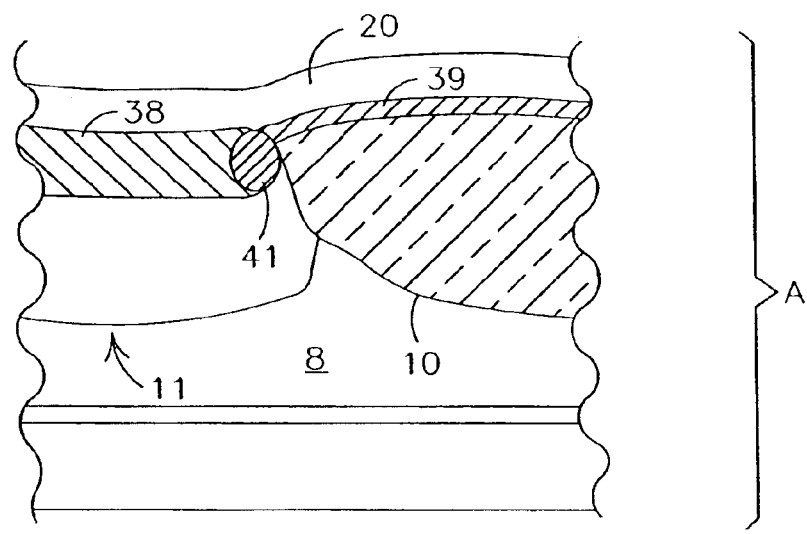

As can be best seen in FIG. 4, which is an exploded view of region A shown in FIG. 3, the extent to which titanium oxide can form at a titanium/silicon dioxide interface is depicted. The device structure illustrated in FIG. 4 depicts the state of the structure subsequent to high temperature annealing. It can be seen in FIG. 4 that a layer of titanium oxide 39 persists at an interface between field oxide region 10 and titanium deposition layer 20 following high temperature annealing. Particularly troublesome is the formation of one or more regions of titanium oxide 41 in the contact area 23 encroaching into the active area 13. The interfacial titanium oxide 41 formed in such regions alters various electrical and structural characteristics of this critical portion of a semiconductor device, such as by increasing contact resistance, and even preventing contact with a silicon contact area. Further, if the TiN layer formed is used as a local interconnect as described further below, the resistance of the interconnect is adversely affected by the interfacial $TiO_2$ 39 formed over the field oxide regions 10.

Figure 5:
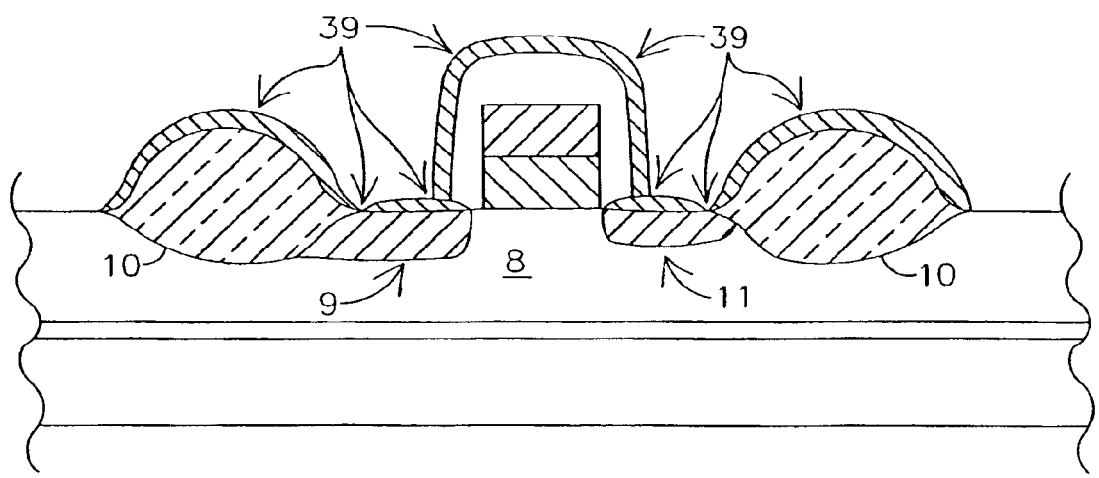

As was discussed previously, oxygen can diffuse out of the oxide regions and form interfacial $TiO_2$ during high temperature annealing in accordance with the described salicidation process. The resultant interfacial titanium oxide material, as previously discussed, has been identified as contributing to a number of structural and operating anomalies of varying severity, including device structure reliability problems, such as high contact resistance, and poor thermal stability. As will be described in greater detail hereinbelow, the interfacial titanium oxide is also problematic when employing a titanium nitride local interconnect process, where titanium nitride formed after a high temperature anneal is patterned to serve as a local interconnect. FIG. 5 illustrates the extent to which undesirable titanium oxide formation can afflict a semiconductor device. FIG. 5 shows various locations of a semiconductor device structure at which titanium oxide 39 may form.

FIGS. 6–10 illustrate various process steps associated with a passivation procedure in accordance with the principles of the present invention. For purposes of illustration, and not of limitation, FIGS. 6–10 depict various steps, including passivation steps according to the present invention, associated with the formation of an ohmic contact on a silicon substrate. As used in connection with FIGS. 6–10, substrate assembly refers to a semiconductor substrate which includes a base layer of silicon material of the device being fabricated or a silicon layer formed on another material, such as, for example, silicon on sapphire, or further, substrate assembly may refer to a semiconductor substrate having one or more various layers formed thereon or regions formed therein. In the method described with reference to FIGS. 6–10, the surfaces upon which the various layers defining a device structure are formed may include various surfaces including, but not limited to, an oxide surface, a silicon containing surface of a silicon region, such as a doped or undoped silicon region for silicidation, salicidation, and metalization thereof, a polysilicon region, such as a doped or undoped polysilicon region, used for forming a polycide line, or various other surfaces such as surfaces upon which an interconnect between at least two contact regions of a device structure is formed (e.g., an interconnect between a drain and a bit line of a device).

Figure 6:
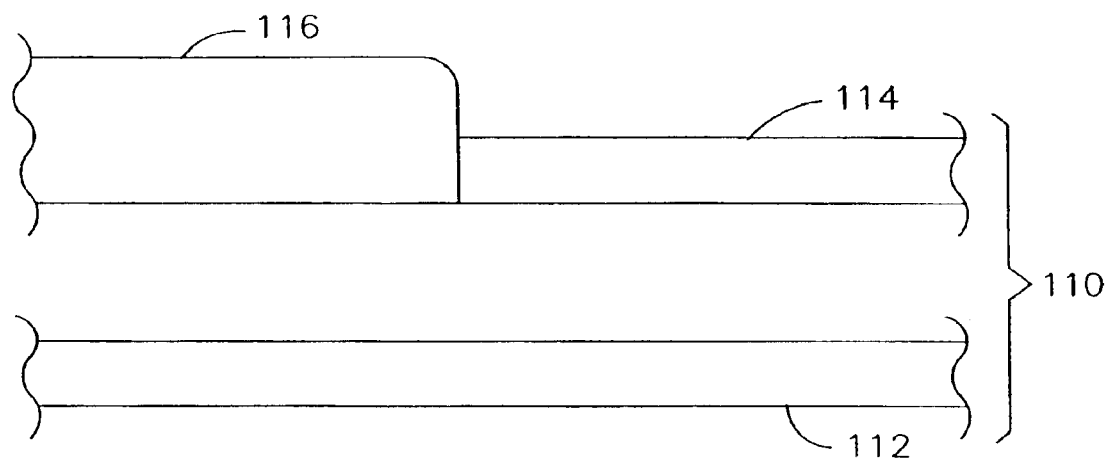
FIGS. 6–10 are illustrative diagrams showing various steps associated with a passivation process in accordance with the principles of the present invention.

A passivation process according to the present invention greatly reduces the amount of undesirable metal oxide formation, such as titanium oxide formation, during semiconductor device fabrication. FIG. 6 illustrates a substrate assembly 110 which includes at least a first region 116 formed of an oxide material and second region 114 formed of another material, i.e., a non-oxide region, such as a silicon substrate region (e.g., source or drain region), a polysilicon region, a silicide region, etc. For example, first region 116 may be a field oxide region and the second region 114 may be a silicon substrate contact area (e.g., source/drain) of a transistor, such as described in FIGS. 1–5. Further, for example, first region 116 may be a BPSG layer in which a via is formed for contact to a conductive second region 114. Yet further, first region 116 may be a field oxide region and the second region 114 may be a silicided contact area to which an interconnect is formed, with the interconnect being formed over the field oxide region.

For purposes of clarity, a passivation process in accordance with the principles of the present invention is described with reference to FIGS. 6–10, wherein the first region 116 is a field oxide region and the second region 114 is a silicon substrate region 114. However, one skilled in the art will recognize that use of a passivation process according to the present invention is beneficial for various structures including an oxide region over which a metal is deposited and thereafter annealed. Further, one skilled in the art will recognize that, although the passivation process is described with use of titanium to prevent interfacial $TiO_2$ formation, the passivation process may also be of benefit for preventing metal oxide formation when other transition metals, such as cobalt or tungsten, are deposited and thereafter annealed. For example, the process may prevent formation of tungsten oxide if tungsten is deposited or prevent cobalt oxide formation if cobalt is formed.

Figure 7:
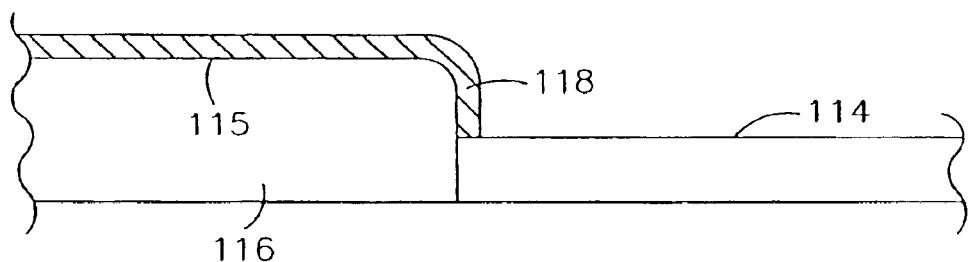

Therefore, for the sake of simplicity, substrate assembly 110 is described to include a silicon substrate 112 which includes silicon region 114, and further includes field oxide region 116 formed thereon. Prior to deposition of titanium 120 over the device structure shown in FIG. 6, the structure is passivated in a nitrogen containing plasma, such as a plasma containing $N_2$, $NH_3$, $NH=NH$, or $NH_2—NH_2$. A passivation layer 118, as shown in FIG. 7, results from the passivation process over oxide region 116. The silicon region 114 remains substantially unaffected by the passivation process as very little reaction occurs between the nitrogen containing plasma and the surface of silicon region 114. The passivation layer 118 as depicted in this illustrative embodiment represents a material layer comprising $Si_xO_yN_z$.

Passivation layer 118 typically has a thickness ranging between about 10 Å and about 100 Å, preferably about 30 Å to about 60 Å. A suitable environment for conducting a plasma passivation procedure according to the present invention includes a pressure ranging between about 0.1 Torr and about 10 Torr, a temperature ranging between about 100° C. and about 500° C., a power associated with the plasma ranging between approximately 300 W and about 3000 W, a frequency of an RF field ranging between 13.56 MHz or in the microwave range at about 2450 MHz, and a processing time of between approximately 20 seconds and about 600 seconds. The concentration of nitrogen within the environment ranges between approximately 10 sccm and about 5,000 sccm.

The plasma treatment according to the present invention may be performed in a conventional PECVD or dry etch chamber. Other suitable plasma treatment environments include downstream plasma strip chambers and any other type of plasma chambers, for example.

Figure 8:
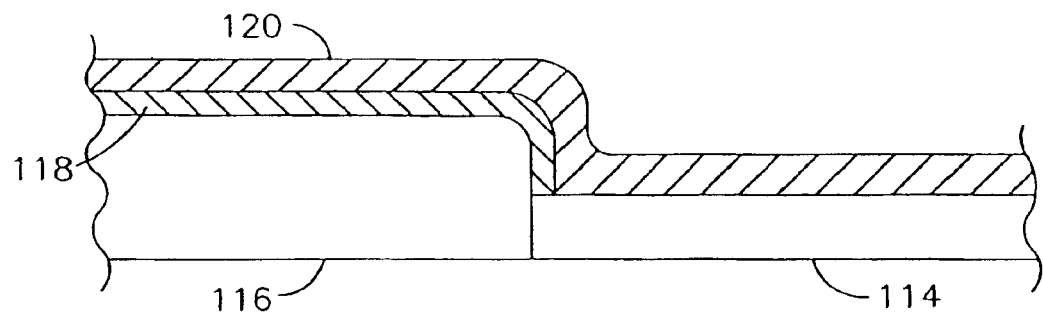

FIG. 8 illustrates an additional processing step subsequent to the passivation step depicted in FIG. 7, in which a layer 120 of titanium is deposited on the device structure. Titanium layer 120 may be formed by a number of known processes, including sputtering, chemical vapor deposition (CVD) and physical vapor deposition (PVD) processes, thermal evaporation, and electron evaporation, or other suitable process as is known in the art. The layer of titanium generally has a thickness in the range of about 100 Å to about 500 Å.

Following formation of titanium layer 120 as is shown in FIG. 8, the device structure is thermally treated, such as by a high temperature anneal. A high temperature anneal process, according to one embodiment, is performed at a temperature between approximately 500° C. and 1,000° C., for a duration of approximately 20 seconds to 10 minutes. Other anneal process parameters include the type of gas used in the anneal, such as $N_2$, He, or any inert gas.

The anneal may take one of various forms and be performed in one or more different atmospheres to accomplish the desired result, e.g., silicidation, salicidation, $TiN_2$ interconnect formation, TiN layer formation such as for a via, etc. For example, the anneal may be a furnace anneal wherein the structure is positioned in a furnace at a predetermined temperature for a predetermined amount of time.

Figure 9:
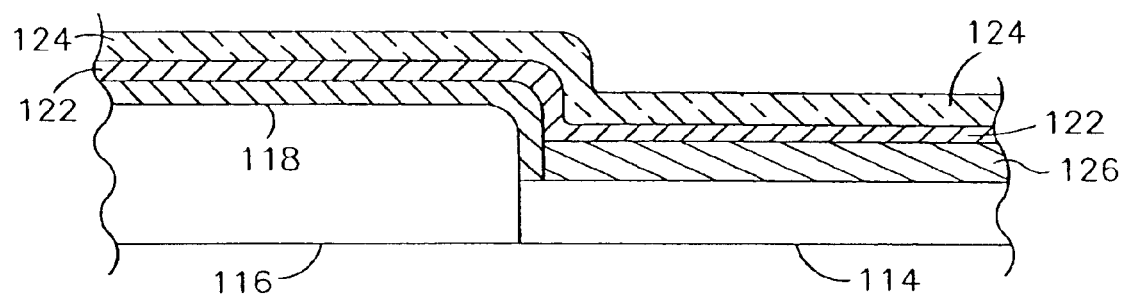

Alternatively, and preferably, the device structure shown in FIG. 8 may be subjected to a rapid thermal process (RTP) anneal at a temperature ranging between approximately 400° C. and 1,000° C. and for a duration of time ranging between approximately 20 seconds and 2 minutes, such as 30 seconds. In one embodiment, as is shown in FIG. 9, an RTP anneal may be performed on the device structure shown in FIG. 8 in a nitrogen containing atmosphere. FIG. 9 illustrates various material layers formed during the RTP anneal in a nitrogen containing atmosphere, alternatively termed a rapid thermal nitridation (RTN) process. It should be noted that the $Si_xO_yN_z$ layer 118 is formed over oxide region 116 by use of the passivation process previously described with reference to FIG. 7 prior to the RTN process. Salicidation or silicidation occurs during the RTN anneal forming titanium silicide ($TiSi_x$) layer 126 on the silicon substrate region 114. Further, a very small amount of $TiSi_x$ may be formed above the $Si_xO_yN_z$ passivation layer 118 and below a titanium nitride layer ($TiN_x$) 124 formed with use of the nitrogen containing atmosphere. A small amount of unreacted titanium may be present in layer 124.

It can be seen from FIG. 9 that passivation layer 118 prevents or significantly inhibits formation of titanium oxide over oxide region 116 and adjacent to titanium silicide ($TiSi_x$) layer 126 proximate oxide region 116. In other words, oxide region 41 as shown in FIG. 4 is prevented from forming. FIG. 9 also illustrates formation of a titanium nitride ($TiN_x$) layer 124 formed over the titanium silicide region 126 and passivation layer 118 which may be used as a local interconnect upon patterning as described further below with reference to FIGS. 11A and 11B. By reducing the amount of $TiO_x$ formation during formation of an interconnect, resistance of the interconnect may be reduced.

Figure 10:
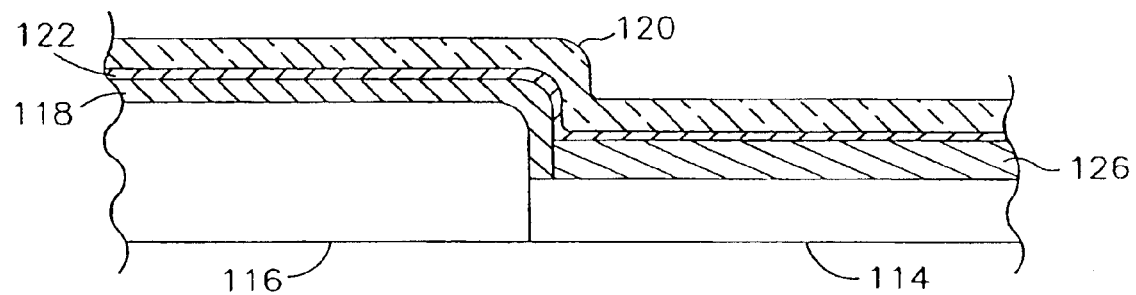

FIG. 10 illustrates an alternate embodiment of a semiconductor device structure in which a passivation layer 118 formed in accordance with the present invention is employed without use of a nitrogen containing atmosphere for the anneal. In this illustrative example, a passivation layer 118, such as an $Si_xO_yN_z$ layer, is formed prior to formation of titanium layer 120 using the nitrogen containing plasma passivation process previously described. After forming titanium layer 120, the device structure is subjected to a thermal treatment involving a high temperature anneal or RTP anneal in an atmosphere devoid of nitrogen, such as an atmosphere containing argon or other inert gas. The high temperature treatment provides for silicidation or salicidation to form $TiSi_x$ on the silicon region 114. A small amount of $TiSi_x$ 122 may form between the $Si_xO_yN_z$ passivation layer 118 and titanium layer 120. However, most of the titanium over the oxide region will remain unreacted. Depending upon the amount of silicidation of the titanium layer 120 in the silicon region, portions of the titanium layer 120 over the silicon region 114 may also remain unreacted.

As was previously discussed, various cleaning procedures, such as an APM cleaning procedure, may be applied to the device structure shown in FIG. 10, as well as in other Figures, during semiconductor device fabrication. An APM cleaning agent, which typically includes $NH_4:H_2O_2:H_2O$ in proportions of approximately 1:1:5, respectively, or other proportions as needed, may be used to selectively etch Ti and TiN material without removing titanium suicide ($TiSi_x$) in a semiconductor device structure, but is ineffective as an etching agent with regard to titanium oxide ($TiO_x$). In other words, a conventional APM cleaning procedure will not remove undesirable titanium oxide at a titanium/silicon dioxide interface.

Further, employment of a conventional HFM cleaning procedure, which typically employs $HCL:H_2O_2:H_2O$ in proportions of approximately 1:1:5, respectively, or other proportions as needed, is also used to selectively etch Ti and TiN material against titanium silicide ($TiSi_x$) in a semiconductor device structure, but is ineffective as an etching method with regard to titanium oxide ($TiO_x$). Use of a passivation process according to the present invention precludes formation of undesirable interfacial titanium oxide, which would otherwise persist within a device structure subsequent to conventional APM and HPM cleaning procedures.

Figure 11A:
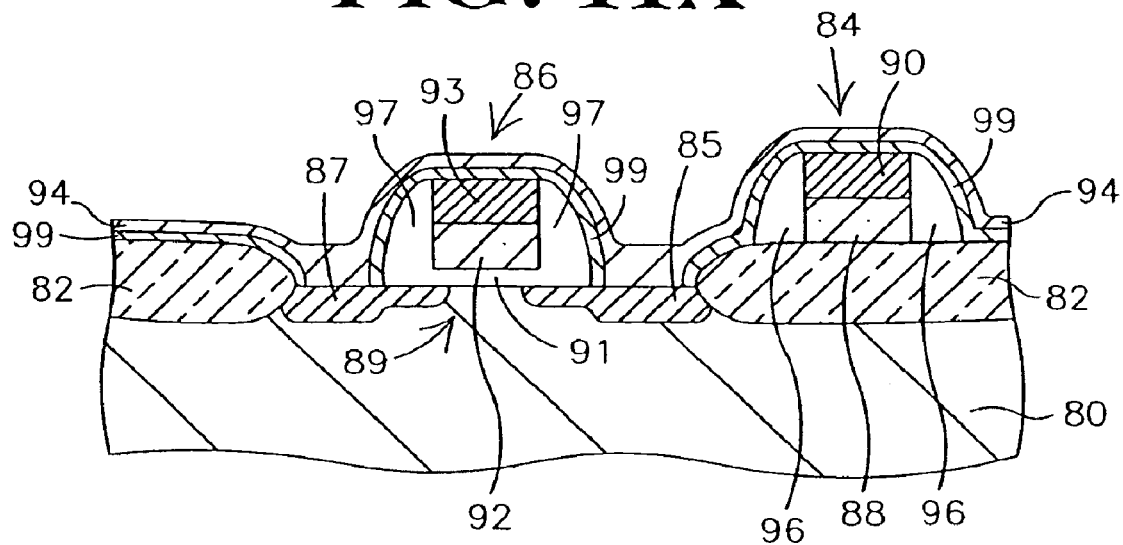
FIGS. 11A and 11B are illustrative diagrams showing steps associated with the formation of a local interconnect in accordance with another embodiment of the present invention.
Figure 11B:
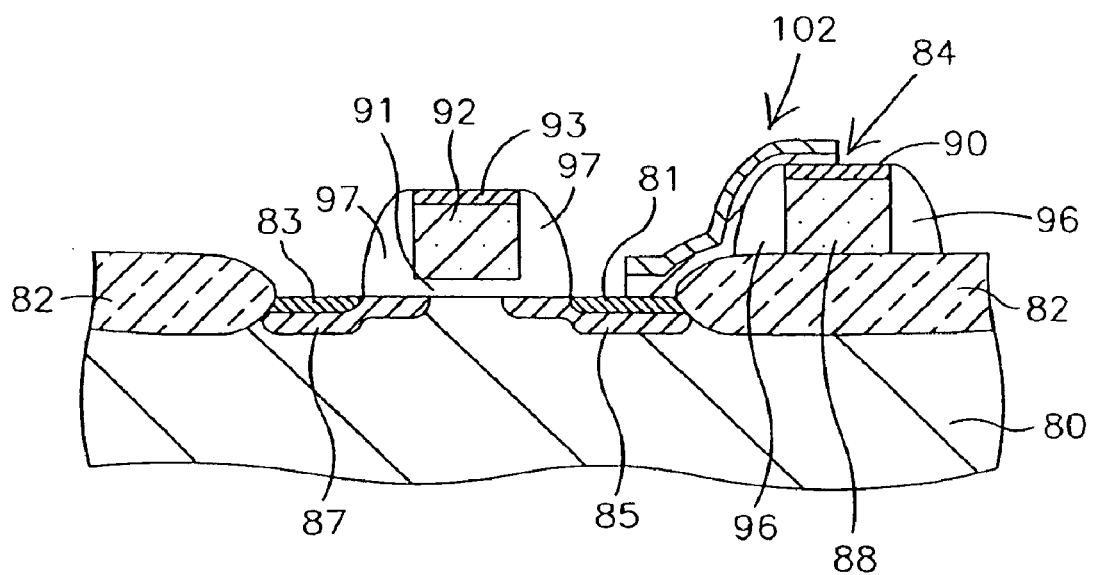

FIGS. 11A and 11B are illustrative of process steps associated with the formation of an interconnect, such as a TiN local interconnect, in accordance with another embodiment of the present invention. FIG. 11A depicts field oxide regions 82 formed on a substrate 80 isolating an active area 89, wherein a source region 87 and a drain region 85 are formed, such as by implantation after formation of gate structure 86.

The gate structure 86 includes conductive region 92 and oxide region 93 of the gate electrode, and further includes spacers 97 and gate oxide 91. A bit line 84 is also formed including conductive regions 88 and 90 (e.g., a polycide structure), with spacers 96 formed at the sides thereof.

At the surface of this particular structure, a TiN local interconnect 102, as is best shown in FIG. 11B, is formed for connecting the drain 85 to the bit line 84. It is readily apparent that the local interconnect can be formed to connect various elements of the structure of a device and that use of the passivation process of the present invention is in no manner limited to the illustrative interconnect shown in FIGS. 11A and 11B. For example, a local interconnect may be developed between various regions of one or more device structures, such as an interconnect between a source and a drain of a pair of transistors.

As is best illustrated in FIG. 11A, and prior to forming titanium layer 94, the device structure is exposed to a plasma containing nitrogen so as to form a passivation layer 99. Passivation layer 99 precludes formation of titanium oxide over oxide regions, such as field oxide 82, spacers 97, etc., and also prevents encroachment of titanium oxide into the active area 89 (e.g., source region 87 and drain region 85). Following the formation of passivation layer 99 and titanium layer 94, subsequent process steps associated with the formation of local interconnect 102 are performed.

The titanium is then annealed in a nitrogen containing atmosphere (e.g., RTN), as previously described with reference to FIG. 9, resulting in a titanium nitride layer which is then patterned to form local interconnect 102 as shown in FIG. 11B. Prior to passivating the oxide surfaces of the structure, e.g., field oxide regions 82 and the other regions such as spacers 97, salicidation may have already been performed with regard to source/drain regions 87, 85. However, as described with respect to FIG. 9, the RTN anneal may be used to silicide such regions at the same time as forming the TiN layers which can later be patterned.

Figure 12:
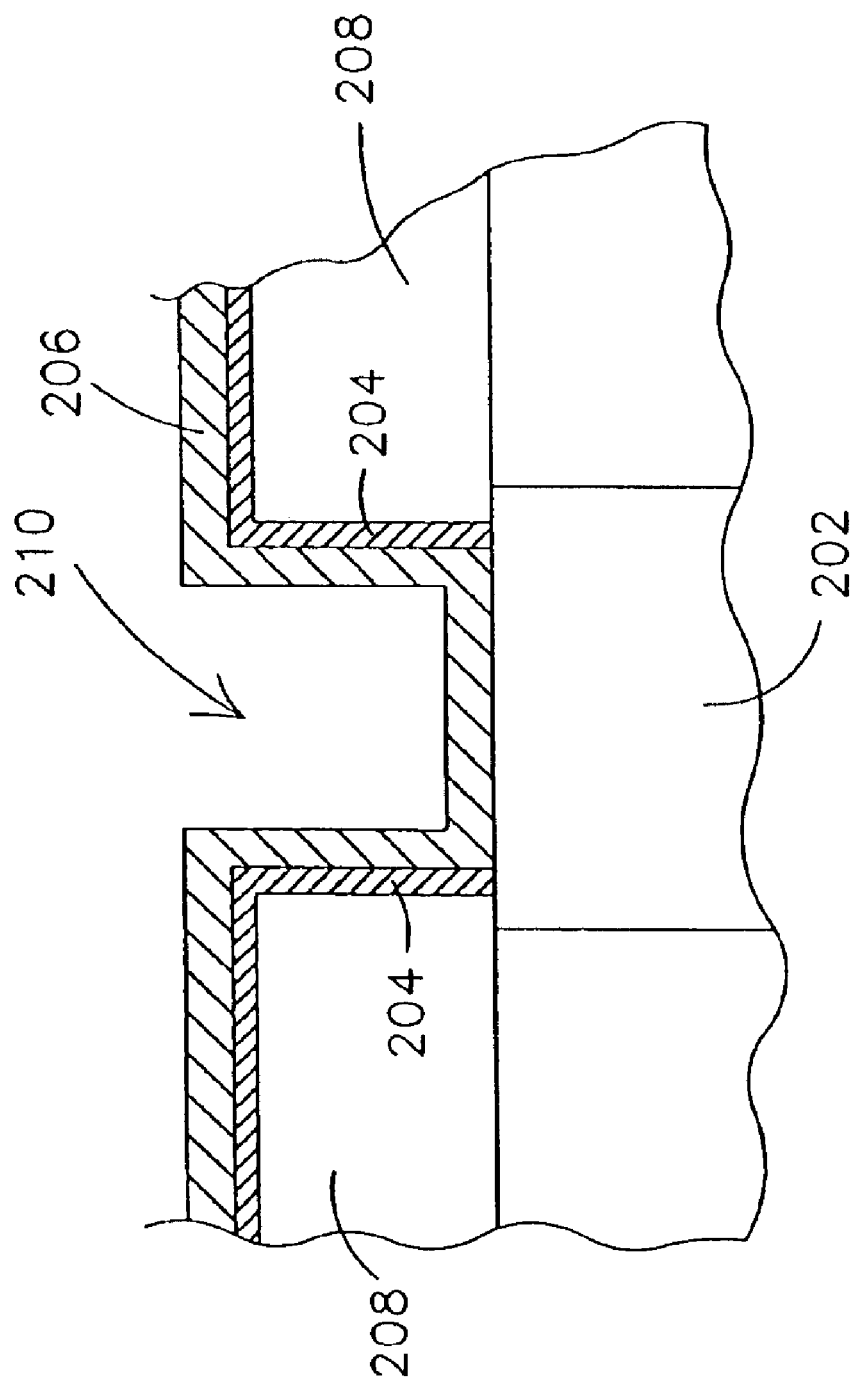
FIG. 12 is an illustrative diagram showing various steps associated with the formation of a bottom electrode of a capacitor or barrier layer of a via.

FIG. 12 is an illustrative diagram showing use of a passivation process associated with the formation of a conductive layer such as titanium nitride in a via or lower electrode of a capacitor structure, in accordance with other embodiments of the present invention. FIG. 12 depicts oxide regions 208, e.g., BPSG, PSG, or any other oxide material, formed on a substrate assembly 200. The oxide regions 208 define an opening 210 wherein a titanium nitride layer 206 is formed. The opening 210 extends to a conductive region 202 of substrate assembly 200.

At the surface of this particular structure, a TiN layer 206 (e.g., a barrier layer for a via, a barrier layer for a capacitor electrode, or an electrode for a capacitor) is formed. Prior to forming the titanium nitride layer 206, the device structure is exposed to a plasma containing nitrogen so as to form a passivation layer 204 according to the present invention as previously described. Passivation layer 204 precludes formation of titanium oxide over oxide regions 208. Following the formation of passivation layer 204, a titanium layer is formed and then annealed in a nitrogen containing atmosphere (e.g., RTN), as previously described with reference to FIG. 9, resulting in a titanium nitride layer 206 which can then be patterned or planarized as desired for a particular application.

Various experiments were performed to demonstrate the effectiveness of a passivation process according to the present invention. In the following Example, three semiconductor wafer samples were prepared, as specified below, two of which were subject to different plasma passivation treatments according to the present invention. A third wafer sample was not subject to a plasma passivation treatment and was used as a control in the experiment.

EXAMPLE #1

Each of the three wafer samples were fabricated on a silicon substrate upon which a TEOS layer was formed having a thickness of between approximately 3,000 Å and 5,000 Å. A passivation process according to the present invention was then performed on two of the wafer samples, #37 and #38, details of which are provided below. Wafer sample #36 was not subjected to a passivation process. A layer of titanium, having a thickness of approximately 300 Å, was then formed over the TEOS layer of each of the three wafer samples using a PVD process.

Wafer sample #37 was subjected to a plasma containing ammonia ($NH_3$) under the following conditions: a pressure of about 3 Torr; a temperature of about 250° C.; a power associated with the plasma of about 1500 W, and a processing time of between about 1 minute and about 2 minutes. The concentration of nitrogen within the environment ranged between about 300 sccm and about 800 sccm. The resultant structure formed on wafer sample #37 was then subjected to a 650° C. RTN treatment for 60 seconds in an atmosphere of $NH_3$.

Wafer #38 was subjected to a plasma containing $N_2$, under the following conditions: a pressure of about 3 Torr; a temperature of about 250° C.; a power associated with the plasma of about 1500 W, a frequency of an RF field of about 13.56 MHz or in the microwave range at about 2450 MHZ, and a processing time of between about 1 minute and about 2 minutes. The concentration of nitrogen within the environment ranged between about 300 sccm and about 800 sccm. The resultant structure formed on wafer sample #38 was then subjected to a 650° C. RTN treatment for 60 seconds in an atmosphere of $N_2$.

The three wafer samples were then subject to XPS analysis, such as by use of an XPS device available under the trade designation Phi (Φ) 5600 from Physical Electronics (Eden Prairie, Minn.). The operating conditions for obtaining the experimental results included an X-ray source of 350 W, monochromatic AL kα (hV=1486.6 eV), 45 degree extraction, and 800 μm extraction aperture.

Table 1 provided below includes experimental data developed from depth profiles of the three semiconductor wafers subjected to different plasma passivation treatments. Of particular concern was the diffusion of oxygen within the wafer structures. The data obtained and recorded for the three wafer samples include plasma treatment employed, surface oxide layer thickness, total titanium layer thickness, titanium oxynitride layer thickness, titanium oxide layer thickness, and titanium silicide layer thickness, as measured in angstroms (Å). It is noted that the oxide and silicide layers overlap, and that the thickness measurements do not take this into account. Further, the thickness of the silicide layer is indicative of a measure of the extent to which silicide was detected. The column labeled Total Titanium is included to provide the full extent of titanium detected.

TABLE 1

| Sample/Treatment | | Thickness (Å) | | | | |
|---|---|---|---|---|---|---|
| Wafer ID | Plasma Type | Surface Oxide (TEOS) | Total Titanium | Titanium Oxynitride | Titanium Oxide | Titanium Silicide |
| #38 | $N_2$ | 50 | 700 | 450 | 250 | 180 |
| #37 | $NH_3$ | 35 | 720 | 480 | 240 | 210 |
| #36 | None | 50 | 710 | 290 | 420 | 200 |

Figure 13:
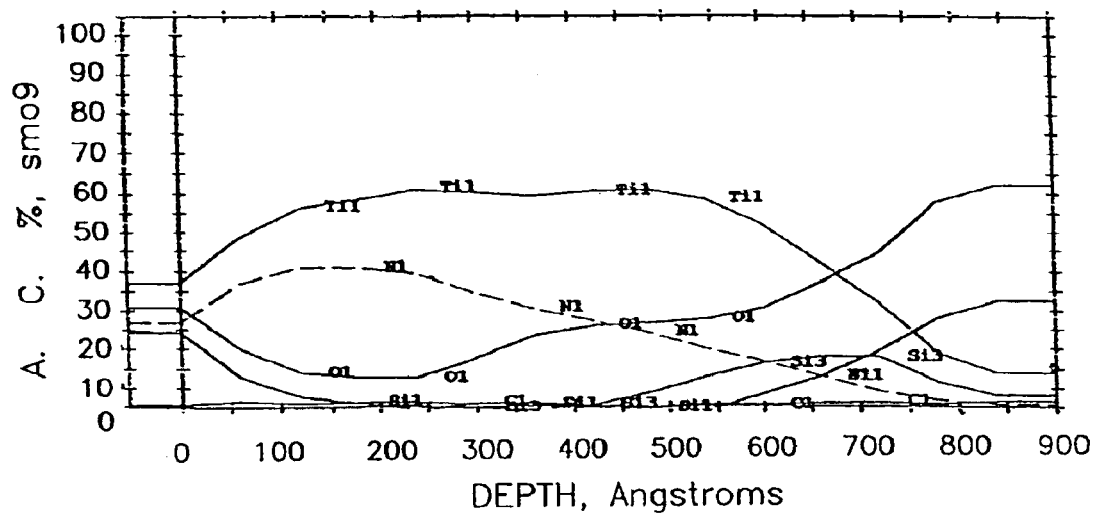
FIGS. 13–15 are profiles developed from the XPS analysis of sample wafers subjected to a plasma containing $N_2$ according to an embodiment of the present invention, a plasma containing ammonia ($NH_3$) according to another embodiment of the present invention, and no plasma treatment as a control, respectively.
Figure 14:
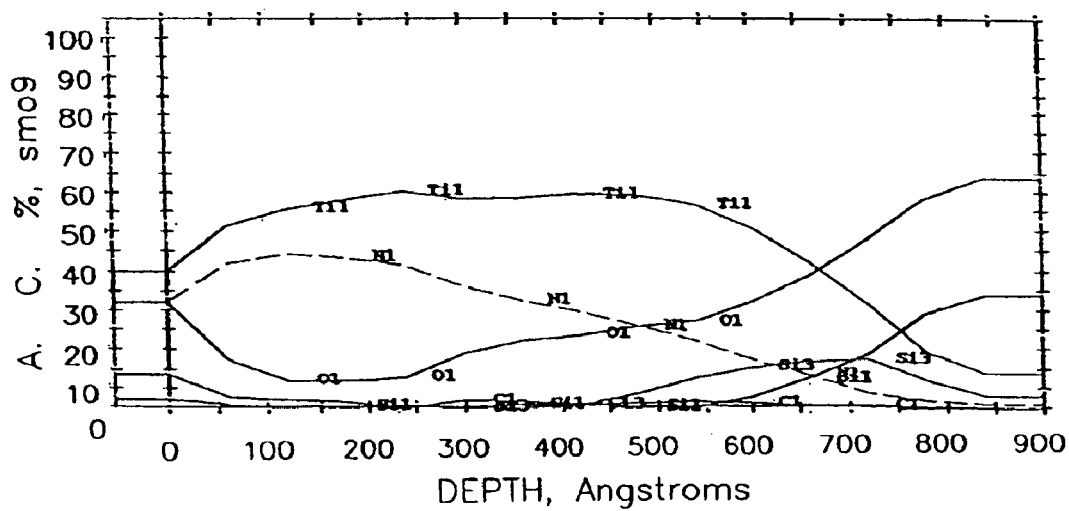
Figure 15:
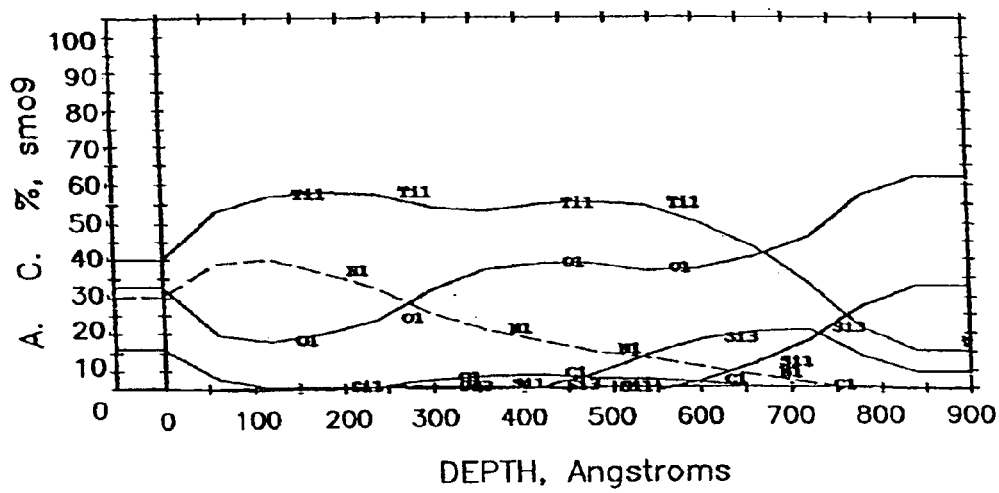
Figure 16:
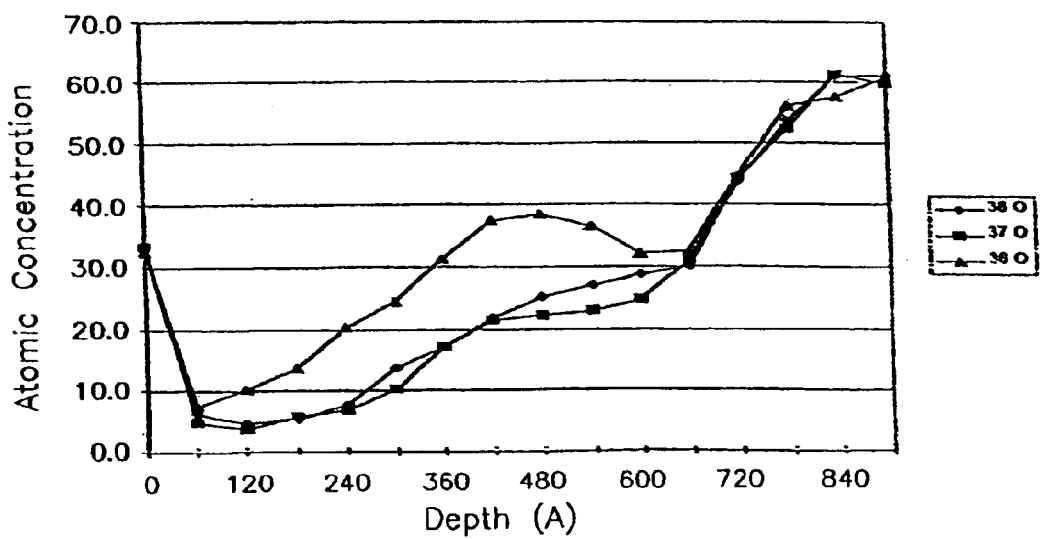
FIGS. 16 and 17 are overlays of oxygen and nitrogen concentrations determined for the three sample wafers characterized in FIGS. 13–15.
Figure 17:
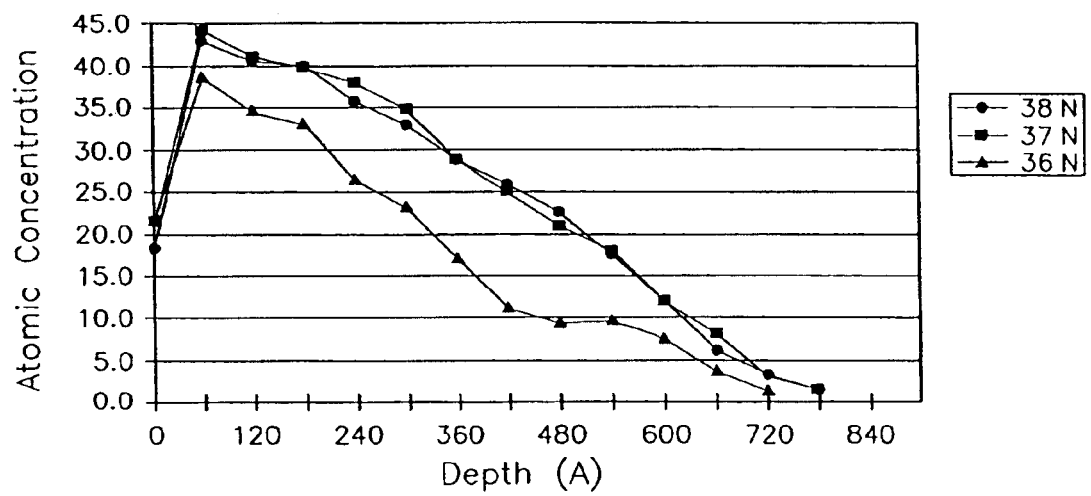

Profiles for each of the samples developed from the XPS analysis results are provided in FIGS. 13–15. FIGS. 16 and 17 are overlays of the oxygen and nitrogen concentrations determined for the three titanium wafer samples. FIG. 13 is an illustration of an XPS profile for wafer sample #38 which was treated with an $N_2$ plasma prior to formation of titanium over the TEOS layer. FIG. 14 is an XPS profile associated with wafer sample #37 which was treated with an $NH_3$ plasma prior to formation of a titanium layer above the TEOS layer. FIG. 15 is an XPS profile associated with wafer sample #36 which was not subjected to plasma treatment.

FIG. 16 is an overlay of the oxygen concentration levels determined for the three titanium wafer samples. FIG. 16 clearly demonstrates a significant difference in oxygen concentration particularly in the 60 Å to about 600 Å depths for wafer sample #36 as compared to wafer samples #37 and #38 which were treated with a plasma passivation process according to the present invention. This indicates that the passivation processes prevented diffusion of oxygen into the titanium layer thereby preventing formation of $TiO_x$. The oxygen concentration for wafer sample #36 was 60% greater in the bulk of the oxynitride, and 40% greater in the bulk of the oxide/silicide as compared to that of wafer samples #37 and #38.

FIG. 17 depicts overlays of the nitrogen concentrations obtained for the three titanium wafer samples. FIG. 17 demonstrates that wafer sample #36 had a significantly different nitrogen concentration as compared to wafer samples #37 and #38. The nitrogen concentration for wafer sample #36 was 30% less in the bulk of the oxynitride layer and over 100% less in the bulk of the oxide/silicide layer as compared to that of wafer samples #37 and #38. A reduced nitrogen concentration indicates an increase of $TiO_x$ concentration as the diffusing oxygen is capturing more Ti, thereby reducing the amount of titanium available to form TiN.

The tabulated results provided in Table 1, as well as the data presented in graphical form in FIGS. 13–17, clearly demonstrate that a significantly greater amount of oxygen diffusion occurs in the titanium nitride layer of wafer sample #36 as compared to that of wafer samples #37 and #38. The plasma passivation treatment of the present invention, as is demonstrated in the data associated with wafer samples #37 and #38, provides for a significantly reduced concentration of titanium oxide within a semiconductor device structure, such as during a silicide or salicide process.

The plasma treatment of the present invention may be performed in a conventional PECVD or dry etch chamber with relative ease and with minimal adjustments to existing processing steps and parameters. As such, the additional plasma treatment steps of the present invention may be added to conventional processes with little or no added cost, and can prevent or significantly reduce titanium oxide formation during a titanium anneal.

The foregoing description of the various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for use in forming an interconnect in the fabrication of a semiconductor device, comprising:
    providing a substrate assembly including a first contact region, a second
    contact region, and an oxide region at a location therebetween;
    exposing a surface of the oxide region to a nitrogen containing plasma so as to form a passivation layer;
    forming a layer of titanium over at least the surface of the oxide region and the first and second contact regions; and
    performing a thermal treatment to form a layer of nitridated titanium extending at least between the first contact region and the second contact region and directly over the oxide region, the passivation layer substantially inhibiting formation of titanium oxide at an interface between the layer of titanium and the oxide region.

2. The method according to claim 1, further comprising patterning the layer of nitridated titanium to form the interconnect.

3. The method according to claim 1, wherein the plasma comprises $N_2$ or $NH_3$.

4. The method according to claim 1, wherein the plasma comprises nitrogen in a range of approximately 10 sccm to approximately 5,000 sccm by volume.

5. The method according to claim 1, wherein performing the thermal treatment comprises performing a rapid thermal process on the substrate assembly in a nitrogen atmosphere.

6. The method according to claim 5, wherein the rapid thermal process is performed at a temperature ranging between approximately 400° C. and approximately 1,000° C. for a duration of time ranging between approximately 20 seconds and approximately 2 minutes.

7. The method according to claim 1, wherein performing the thermal treatment comprises siliciding at least one of the first or second contact regions.

8. The method according to claim 1, wherein the passivation layer comprises $Si_xO_yN_z$.

9. The method according to claim 8, wherein the passivation layer has a thickness ranging between approximately 10 Å and approximately 100 Å.

* * * * *